(12) United States Patent
Edmundson et al.

(10) Patent No.: US 11,330,711 B2
(45) Date of Patent: May 10, 2022

(54) FLEXIBLE AND DURABLE PRINTED CIRCUITS ON STRETCHABLE AND NON-STRETCHABLE SUBSTRATES

(71) Applicant: W.L. Gore & Associates, Inc., Newark, DE (US)

(72) Inventors: Mark D. Edmundson, Philadelphia, PA (US); Paul D. Gassler, Lincoln University, PA (US); Justin J. Skaife, Earleville, MD (US); Scott J. Zero, Newark, DE (US)

(73) Assignee: W. L. Gore & Associates, Inc., Newark, DE (US)

( * ) Notice: Subject to any disclaimer, the term of this patent is extended or adjusted under 35 U.S.C. 154(b) by 0 days.

(21) Appl. No.: 17/049,556

(22) PCT Filed: May 8, 2019

(86) PCT No.: PCT/US2019/031232
§ 371 (c)(1),
(2) Date: Oct. 21, 2020

(87) PCT Pub. No.: WO2019/217503
PCT Pub. Date: Nov. 14, 2019

(65) Prior Publication Data
US 2021/0161009 A1 May 27, 2021

Related U.S. Application Data

(60) Provisional application No. 62/668,453, filed on May 8, 2018.

(51) Int. Cl.
*H05K 1/02* (2006.01)
*H05K 1/03* (2006.01)
*H05K 1/09* (2006.01)

(52) U.S. Cl.
CPC ........... *H05K 1/038* (2013.01); *H05K 1/0277* (2013.01); *H05K 1/0366* (2013.01); *H05K 1/097* (2013.01);
(Continued)

(58) Field of Classification Search
CPC ........................................ H05K 1/0277–0283
See application file for complete search history.

(56) References Cited

U.S. PATENT DOCUMENTS 3,953,566 A 4/1976 Gore
4,443,511 A 4/1984 Worden et al.
(Continued)

FOREIGN PATENT DOCUMENTS

CA 2900130 A1 10/2015
EP 0105629 A2 4/1984
(Continued)

OTHER PUBLICATIONS

Hong et al., "OmniDirectionally Stretchable and Transparent Graphene Electrodes," ACS Nano (2016); 10:9446-9455.
(Continued)

*Primary Examiner* — Jeremy C Norris
(74) *Attorney, Agent, or Firm* — Greenberg Traurig, LLP

(57) ABSTRACT

The present invention is directed to flexible conductive articles (600) that include a printed circuit (650) and a stretchable or non-stretchable substrate (610). In some embodiments, the substrate has a printed circuit on both sides. The printed circuit contains N therein a porous synthetic polymer membrane (660) and an electrically conductive trace (670) as well as a non-conducive region (640). The electrically conductive trace is imbibed or otherwise incorporated into the porous synthetic polymer membrane. In some embodiments, the synthetic polymer membrane is microporous. The printed circuit may be discontinuously
(Continued)

bonded to the stretchable or non-stretchable substrate by adhesive dots (620). The printed circuits may be integrated into garments, such as smart apparel or other wearable technology.

19 Claims, 9 Drawing Sheets

(52) U.S. Cl.
CPC ............... *H05K 2201/015* (2013.01); *H05K 2201/0116* (2013.01); *H05K 2201/09245* (2013.01)

(56) References Cited

U.S. PATENT DOCUMENTS

| | | |
|---|---|---|
| 4,557,957 A | 12/1985 | Manniso |
| 4,720,400 A | 1/1988 | Manniso |
| 4,972,846 A | 11/1990 | Owens et al. |
| 4,985,296 A | 1/1991 | Mortimer |
| 5,026,513 A | 6/1991 | House et al. |
| 5,148,806 A | 9/1992 | Fukui et al. |
| 5,183,545 A | 2/1993 | Branca et al. |
| 5,188,890 A | 2/1993 | Ohashi et al. |
| 5,269,810 A | 12/1993 | Hull et al. |
| 5,476,589 A | 12/1995 | Bacino |
| 5,524,908 A | 6/1996 | Reis |
| 5,527,569 A | 6/1996 | Hobson et al. |
| 5,753,358 A | 5/1998 | Korleski |
| 5,785,787 A | 7/1998 | Wojnarowski et al. |
| 5,885,738 A | 3/1999 | Hannon |
| 5,904,978 A | 5/1999 | Hanrahan et al. |
| 5,910,354 A | 6/1999 | Meola et al. |
| 6,016,848 A | 1/2000 | Egres |
| 6,210,789 B1 | 4/2001 | Hanrahan |
| 6,218,000 B1 | 4/2001 | Rudolf et al. |
| 6,379,745 B1 | 4/2002 | Kydd et al. |
| 6,528,572 B1 | 3/2003 | Patel et al. |
| 6,689,835 B2 | 2/2004 | Amarasekera et al. |
| 6,737,158 B1 | 5/2004 | Thompson |
| 7,306,729 B2 | 12/2007 | Bacino et al. |
| 7,354,988 B2 | 4/2008 | Charati et al. |
| 7,481,952 B2 | 1/2009 | Ren et al. |
| 7,678,701 B2 | 3/2010 | Tredwell et al. |
| 7,789,908 B2 | 9/2010 | Sowinski et al. |
| 7,932,184 B2 | 4/2011 | Ishii |
| 8,278,757 B2 | 10/2012 | Crain et al. |
| 8,974,739 B2 | 3/2015 | Yoshida |
| 9,288,903 B2 | 3/2016 | Hasegawa et al. |
| 9,441,088 B2 | 9/2016 | Sbriglia et al. |
| 9,446,232 B2 | 9/2016 | Duncan et al. |
| 9,573,339 B2 | 2/2017 | Hodgins et al. |
| 9,926,416 B2 | 3/2018 | Sbriglia |
| 9,932,429 B2 | 4/2018 | Sbriglia |
| 2003/0181568 A1 | 9/2003 | Amarasekera et al. |
| 2004/0059717 A1 | 3/2004 | Klare et al. |
| 2004/0173978 A1 | 9/2004 | Bowen et al. |
| 2004/0192082 A1 | 9/2004 | Wagner et al. |
| 2009/0008142 A1* | 1/2009 | Shimizu ............... H05K 1/0366 174/261 |
| 2009/0227165 A1 | 9/2009 | Lmai |
| 2011/0167547 A1 | 7/2011 | Jain |
| 2013/0160183 A1 | 7/2013 | Reho |
| 2013/0183515 A1 | 7/2013 | White |
| 2014/0121557 A1 | 5/2014 | John et al. |
| 2014/0242355 A1 | 8/2014 | Castille |
| 2015/0371880 A1* | 12/2015 | De Beijer ............. H01L 23/495 257/787 |
| 2016/0032069 A1 | 2/2016 | Sbriglia |
| 2016/0162774 A1 | 6/2016 | Mei et al. |
| 2016/0167291 A1 | 6/2016 | Zagl |
| 2016/0358849 A1 | 12/2016 | Jur |
| 2018/0067529 A1 | 3/2018 | Jhong |
| 2018/0086025 A1* | 3/2018 | Yoshigahara ............. C08J 5/24 |
| 2019/0290496 A1 | 9/2019 | Brownhill et al. |

FOREIGN PATENT DOCUMENTS

| | | |
|---|---|---|
| EP | 0110626 A2 | 6/1984 |
| EP | 0317256 A2 | 5/1989 |
| EP | 3364728 A1 | 8/2018 |
| GB | 1409229 A | 10/1975 |
| JP | 1984064640 A | 4/1984 |
| JP | 1984187845 A | 10/1984 |
| WO | 9703812 A1 | 2/1997 |
| WO | 2004005413 A1 | 1/2004 |
| WO | 2016135188 A1 | 9/2016 |
| WO | 2017065272 A1 | 4/2017 |
| WO | 2017086583 A1 | 5/2017 |

OTHER PUBLICATIONS

Hu et al., "Inkjet Printing of Nanoporous Gold Electrode Arrays on Cellulose Membranes for High-Sensitive Paper-Like Electrochemical Oxygen Sensors Using Ionic Liquid Electrolytes," Anal. Chem. (2012); 84:3745-3750.

Jeong et al., "Solderable and Electroplatable flexible electronic circuit ona porous stretchable elastomer," Nat. Commun., DOI: 10.1038/ncomms1980, (2012).

Lim et al., "Surface Treatments for Inkjet Printing onto a PTFE-Based Substrate for High Frequency Applications," Ind. Eng. Chem. Res., (2013); 52:11564-11574.

Merilampi et al., "The characterization of electrically conductive silver ink patterns on flexible substrates," Microelectronics Reliability (2009); 49:782-790.

Paiz and Elmer, "Adhesion of continuous Ink Jet Inks on PTFE," Wire and Cable Technology International (May/Jun. 2013); 5 pages.

Park et al., "Design of conductive composite elastomers for stretchable electronics," Nano Today (2014); 9:244-260.

Pu et al., "Highly Stretchable Microsupercapacitor Arrays with Honeycomb Structures for Integrated Wearable Electronic Systems," ACS Nano (2016); 10:9306-9315.

Rogers et al., "Materials and Mechanics for Stretchable Electronics," Science (2010); 327:1603-1607.

Vuorinen et al., "Inkjet-Printer Graphene/PEDOT:PSS Temperature Sensors on a Skin Conformable Polyurethane Substrate," Scientific Reports, DOI: 10.1038/srep35289 (Oct. 2016).

Yao and Zhu, "Nanomaterial-Enabled Stretchable Conductors: Strategies, Material and Devices," Adv. Mater., DOI: 10.1002/adma. 201404446 (2015).

Yetisen et al., "Nanotechnology in Textiles," ACS Nano (2016); 10:3042-3068.

\* cited by examiner

FLEXIBLE AND DURABLE PRINTED CIRCUITS ON STRETCHABLE AND NON-STRETCHABLE SUBSTRATES

FIELD

The present disclosure relates generally to printed circuits, and more specifically, to flexible and durable printed circuits that are bonded to a stretchable or non-stretchable substrate to form a conductive article.

BACKGROUND

Conventionally, flexible circuits are built upon stiff materials such as Mylar or Kapton®. While these materials are considered flexible in comparison to the traditional copper and fiberglass circuit boards, they do not exhibit flexibility that is comparable to that of textiles or skin. The incorporation of flexible circuits into garments and/or other skin-worn devices is limited by this stiffness. Indeed, many existing circuit materials are too stiff to be integrated into textiles and remain durably reliable, particularly upon flexing in use and during washing or other cleaning regimens.

In this regard, a number of conductive inks have been developed that are thin and stretchable. These inks are conventionally printed directly onto textiles and are able to retain the flexibility, stretch, and hand of the textile. However, they suffer from significant durability and electrical connectivity problems. For instance, when a textile is stretched, the textile fiber bundles move significantly relative to each other. The conductive inks are incapable of withstanding the elongation required to bridge the gap between the textile fiber bundles, resulting in breaks and open circuits.

The same stretchable conductive inks have been printed onto urethane films and then heat bonded to stretch textiles. This results in a more durable circuit than printing directly onto textiles, however the resulting laminate has significantly less stretch than the original textile. In other existing art, conductive inks have been sandwiched between insulating inks and then thermally laminated to textiles. However, thin coatings of the insulating inks are unable to effectively support the conductive ink. Increasing the thickness of the insulating ink can improve the durability, but only at great expense of textile's stretchability.

Despite the advances in flexible electrical circuits, a need still exists for durable and effective flexible electrical circuit systems for a variety of applications ranging from garments to medical diagnostic and treatment devices, as well as many other suitable end use applications.

SUMMARY

The present disclosure relates to a conductive article that has high flexibility and durability that includes a printed circuit bonded to a substrate. The printed circuit includes a porous synthetic polymer membrane and at least one electrically conductive trace and may be discontinuously or continuously bonded to the substrate. The substrate may be a stretchable or non-stretchable substrate, such as a stretchable textile, a stretchable fabric, a stretchable laminate, stretchable fibers, a stretchable nonwoven material, or a stretchable membrane. In exemplary embodiments, the stretchable substrate is a stretchable textile or stretchable fabric. The electrically conductive trace may be imbibed or otherwise introduced into the pores and through the thickness of the porous synthetic polymer membrane. The electrically conductive trace includes a continuous network of conductive particles and may have the form of an electrically conductive pattern or circuit. In exemplary embodiments, non-conducting regions are located alongside the electrically conductive trace. In some embodiments, an insulative overcoat may be applied over the electrically conductive trace to assist in protecting the electrically conductive trace from external elements. In at least one embodiment, the porous synthetic polymer membrane is an expanded fluoropolymer membrane, such as expanded polytetrafluoroethylene membrane. The conductive article has a wash durability of at least 10 wash cycles as determined by the Wash Test Durability test method. Also, the conductive article advantageously is flexible, having a flexibility of less than 0.1 grams force-cm$^2$/cm as determined by the Kawabata test method.

BRIEF DESCRIPTION OF THE DRAWINGS

The accompanying drawings are included to provide a further understanding of the disclosure and are incorporated in and constitute a part of this specification, illustrate embodiments, and together with the description serve to explain the principles of the disclosure.

DETAILED DESCRIPTION

Figure 1:
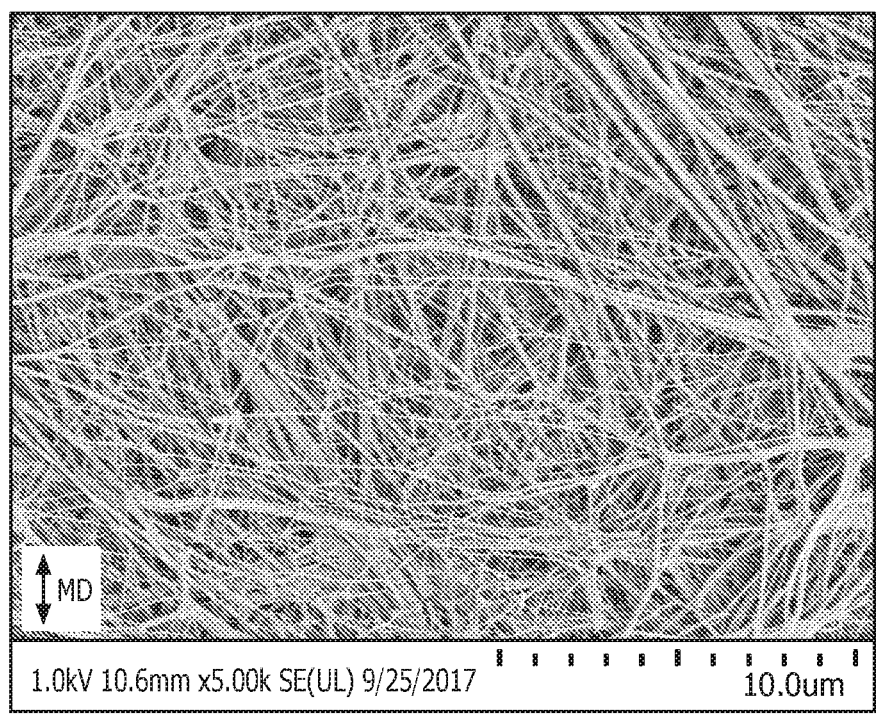
FIG. 1 is a scanning electron micrograph (SEM) image of a porous expanded polytetrafluoroethylene (ePTFE) membrane (Membrane 1) according to at least one embodiment.

Persons skilled in the art will readily appreciate that various aspects of the present disclosure can be realized by any number of methods and apparatus configured to perform the intended functions. It should also be noted that the accompanying drawing figures referred to herein are not necessarily drawn to scale, but may be exaggerated to illustrate various aspects of the present disclosure, and in that regard, the drawing figures should not be construed as limiting. It is to be appreciated that the terms "electrically conductive trace", "conductive trace", and "trace" may be used interchangeably herein. The terms "membrane" and "film" may be used interchangeably herein. As used herein, the term "synthetic polymer membrane" is meant to include either a porous synthetic polymer membrane or a microporous synthetic polymer membrane.

The present invention is directed to flexible conductive articles that include a printed circuit and a stretchable or non-stretchable substrate. The printed circuit contains an electrically conductive trace. The electrically conductive trace may be imbibed or otherwise incorporated into the pores and through the thickness of a porous synthetic polymer membrane. In some embodiments, the synthetic polymer membrane is microporous. The printed circuit may be discontinuously bonded to the stretchable or non-stretchable substrate. In an alternate embodiment, the printed circuit is continuously bonded to the substrate. The printed circuits may be integrated into garments, such as smart apparel or other wearable technology.

As discussed above, the conductive articles include a printed circuit that includes at least one electrically conductive trace and a porous synthetic polymer membrane. The term "electrically conductive trace" as used herein is meant to describe a continuous line or continuous pathway that is able to conduct electrons therethrough. In exemplary embodiments, non-conducting regions are located alongside the electrically conductive trace. In some embodiments, an electrically conductive ink may be used to deposit the electrically conductive trace into the synthetic polymer membrane. The term "electrically conductive ink" as used herein refers to materials that incorporate electrically conductive particles in a carrier liquid (e.g. a solvent). In some embodiments, the electrically conductive particles include, silver, gold, copper, or platinum particles. Non-limiting examples of suitable electrically conductive inks include 2108-IPA (Nanogap Inc., Richmond, Calif.), UTDAgPA (UT Dots, Inc., Champaign, Ill.), and UTDAg60X (UT Dots, Inc., Champaign, Ill.).

Non-limiting examples of other electrically conductive materials that form the electrically conductive trace include electrically conductive metal particles or nanoparticles (e.g., silver, gold, copper, and platinum), particles or nanoparticles of other electrically conductive materials (e.g., graphite or carbon black), electrically conductive nanotubes, electrically conductive metal flakes, electrically conductive polymers, and combinations thereof. As used herein, the term "nanoparticle" is meant to describe a particle that has a size from 1.0 nm to 100 nm in at least one dimension of the conductive particle.

The electrically conductive trace may be in the form of an electrically conductive pattern that can be used to form a circuit through which an electric current may flow. The pattern may create an open path, such as, for example, the parallel lines exemplified in FIG. 4. In some embodiments, electronic components (e.g., surface mount electronic components) may be electrically coupled (e.g., adhered) to a conductive trace pattern to create a circuit. In some embodiments, electronic components (e.g., an electronic module containing, for example, a battery, and/or a transmitter) may be electrically coupled (e.g., adhered) to a conductive trace pattern to create a circuit. The electrically conductive trace may be configured to couple with resistors, capacitors, light-emitting diodes (LEDs), integrated circuits, sensors, power sources, and data transmitters and receivers. Additionally, the electrically conductive trace may be used to transmit information, such as the user's heart rate or oxygen saturation in the blood to the user or the user's doctor, for example.

As noted above, the electrically conductive trace is located within the synthetic polymer membrane. Non-limiting examples of suitable porous synthetic polymer membranes include expanded polytetrafluoroethylene (ePTFE), polyvinylidene fluoride (PVDF), fluorinated ethylene propylene (FEP), perfluoroalkoxy alkane (PFA), polyester sulfone (PES), expanded poly (p-xylylene) (ePPX) as taught in U.S. Patent Publication No. 2016/0032069, porous expanded ultra-high molecular weight polyethylene (eUHMWPE) as taught in U.S. Pat. No. 9,926,416 to Sbriglia, porous expanded ethylene tetrafluoroethylene (eETFE) as taught in U.S. Pat. No. 9,932,429, porous expanded polylactic acid (ePLLA) as taught in U.S. Pat. No. 7,932,184 to Sbriglia, et al., porous expanded vinylidene fluoride-co-tetrafluoroethylene or trifluoroethylene [VDF-co-(TFE or TrFE)] polymers as taught in U.S. Pat. No. 9,441,088 to Sbriglia, and any combination thereof. In at least one embodiment, the synthetic polymer membrane is a microporous synthetic polymer membrane, such as a microporous fluoropolymer membrane having a node and fibril microstructure where the nodes are interconnected by the fibrils and the pores are the voids or space located between the nodes and fibrils throughout the membrane. An exemplary node and fibril microstructure is described in U.S. Pat. No. 3,953,566 to Gore.

The microporous membranes described herein may be differentiated from other membranes or structures in that they have a specific surface area of greater than about 4.0 $m^2/cm^3$, greater than about 10 $m^2/cm^3$, greater than about 50 $m^2/cm^3$, greater than about 75 $m^2/cm^3$, and up to 100 $m^2/cm^3$. In some embodiments, the specific surface area is from about 4.0 $m^2/cm^3$ and 100 $m^2/cm^3$. Herein, specific surface area is defined on the basis of skeletal volume, not envelope volume. In addition, the majority of the fibrils in the microporous synthetic polymer membrane have a diameter that is less than about 1.0 µm, or from about 0.1 µm to about 1.0 µm, from about 0.3 µm to about 1.0 µm, from about 0.5 µm to about 1.0 µm, or from about 0.7 µm to about 1.0 µm. Additionally, the microporous membranes are thin, having a thickness less than about 100 µm, less than about 75 µm, less than about 50 µm, less than about 35 µm, less than about 25 µm, less than about 20 µm, less than about 10 µm, less than about 5 µm, or less than about 3 µm. In at least one exemplary embodiment, the synthetic polymer membrane is an expanded polytetrafluoroethylene (ePTFE) membrane. Expanded polytetrafluoroethylene (ePTFE) membranes prepared in accordance with the methods described in U.S. Pat. No. 3,953,566 to Gore, U.S. Patent Publication No. 2004/0173978 to Bowen et al., U.S. Pat. No. 7,306,729 to Bacino et al., U.S. Pat. No. 5,476,589 to Bacino, or U.S. Pat. No. 5,183,545 to Branca et al. may also be used herein.

The electrically conductive material (e.g., electrically conductive ink) may be applied to the porous synthetic polymer membrane such that it is imbibed or otherwise incorporated into the porous synthetic polymer membrane to place the electrically conductive material, and thus the conductive trace within the synthetic polymer membrane and form a printed circuit. "Imbibed" as used herein is meant to describe the inclusion and/or deposition of an electrically conductive trace into the existing pores or void spaces of a porous or microporous synthetic polymer membrane via a liquid carrier (such as an electrically conductive ink) and specifically excludes filled membranes where the electrically conductive trace is an integral part of the synthetic polymer membrane and which may have some exposed electrically conductive trace within a pore or void space. It is to be noted that any known method of filling pre-existing pores or void spaces in a porous membrane may be utilized herein. In some embodiments, the conductive trace occupies or fills the pores through the thickness of a porous or microporous synthetic polymer membrane. As such, the electrically conductive trace may occupy the majority of the pore volume in the porous or microporous synthetic polymer membrane. In exemplary embodiments, the pores of the porous or microporous synthetic polymer membrane are filled with an amount of electrically conductive material that is sufficient to create a conductive trace for the passage of electrons therethrough. The electrically conductive material that forms the electrically conductive trace may be applied to the porous synthetic polymer membrane by known deposition and imbibing methods, such as, for example, ink-jet printing, gravure printing, and flexographic printing to form the electrically conductive trace. The synthetic polymer membrane having therein an electrically conductive trace is referred to herein as a printed circuit.

As discussed herein, the electrically conductive trace is imbibed or otherwise incorporated into the synthetic polymer membrane to form a printed circuit. In at least one embodiment, a stencil having the desired pattern is applied to the porous synthetic polymer membrane. It is to be appreciated that other forms of forming a pattern on the synthetic polymer membrane known to those of skill in the art are considered to be within the purview of this disclosure. In exemplary embodiments, the porous synthetic polymer membrane is flat and contains no wrinkles when the electrically conductive material is applied. The electrically conductive material (e.g., an electrically conductive ink) may be over-applied (e.g., excess electrically conductive material is applied) over the stencil such that once the stencil is removed, the electrically conductive material is imbibed into the pores of the porous synthetic polymer membrane in the desired pattern to place the electrically conductive material, and thus the conductive trace, within the porous synthetic polymer membrane and form a printed circuit. Excess electrically conductive material present on the surface of the stencil may be removed prior to removing the stencil. However, it is to be appreciated that a negligible amount conductive material may remain on the surface or on portions of the surface of the synthetic polymer membrane as a consequence of the imbibing process. Other methods of incorporating or imbibing the electrically conductive material into the pores of the porous synthetic polymer membrane known in the art are also considered to be within the purview of this disclosure.

Figure 6A:
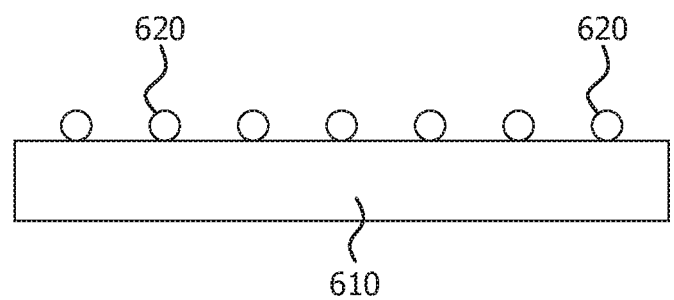
FIG. 6A is a schematic illustration of a substrate having an adhesive applied in a gravure pattern in the form of adhesive dots according to at least one embodiment.

In forming the conductive article, a discontinuous adhesive may be applied to the substrate prior to the application of the printed circuit (e.g., synthetic polymer membrane and conductive trace). The printed circuit may be discontinuously attached to the substrate by an adhesive. The adhesive may be a thermoplastic adhesive or a thermoset adhesive. In some embodiments, as illustrated in FIG. 6A, the adhesive may be applied to the substrate 610 in a gravure pattern in the form of adhesive dots 620. It is to be appreciated that the pattern of the adhesive on the substrate is not limited so long as the substrate is able to bend in one or more directions (e.g., maintains flexibility). Thus, other adhesive patterns, such as grids or parallel lines are considered to be within the purview of the disclosure as long as the flexibility of the substrate is maintained. As noted above, the substrate may be stretchable or non-stretchable. As used herein, the term "stretchable" is meant to denote a material (e.g., a textile or fabric) that can be pulled in one or more directions, but when it is released, the material returns or substantially returns to its original shape. A stretchable substrate may be stretched to 1.25 times, 1.5 times, 1.7 times, 2 times, 3 times, 4 times, 5 times, 6 times, 7 times, 8 times, 9 times, or 10 times its relaxed length (or more), depending on the elasticity of the stretchable substrate. In some embodiments, the stretchable substrate is stretched until the elastic limit of the substrate is reached. Examples of stretchable substrates that may be used include, but are not limited to, a stretchable textile or fabric, a stretchable laminate (for example, WO2018/067529 A1 to Kelsey), stretchable fibers, a stretchable nonwoven material, or a stretchable membrane. In exemplary embodiments, the printed circuits are bonded to a stretchable textile or stretchable fabric.

Figure 6B:
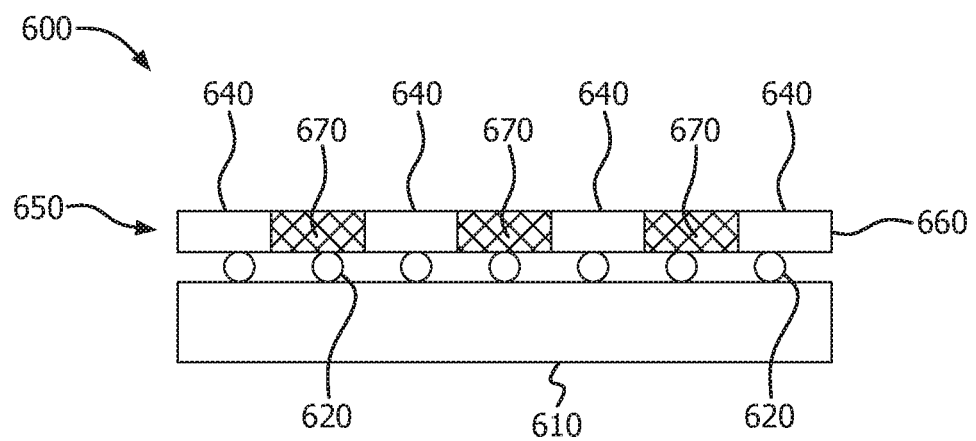
FIG. 6B is a schematic illustration of a conductive article with non-conductive regions positioned adjacent to the imbibed conductive trace according to at least one embodiment.
Figure 6C:
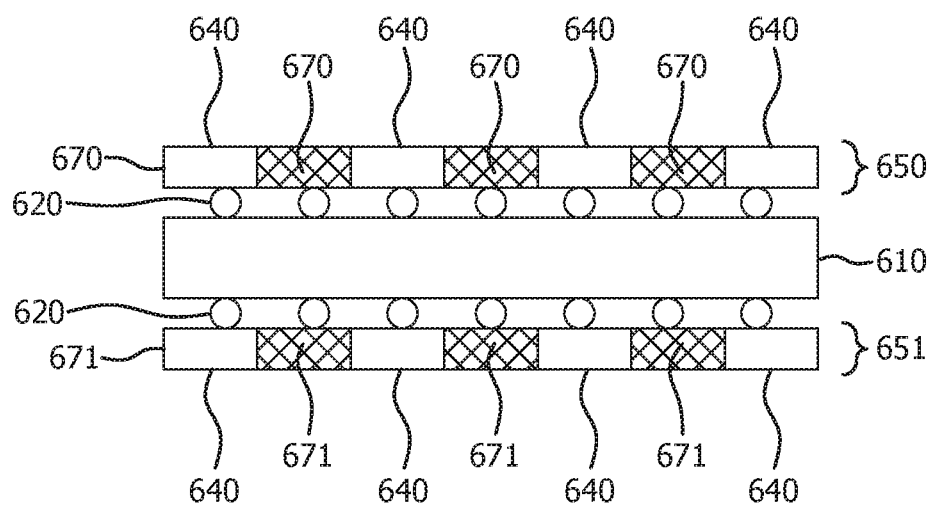
FIG. 6C is a schematic illustration of a conductive article that contains a printed circuit on each side of the substrate according to at least one embodiment.
Figure 7:
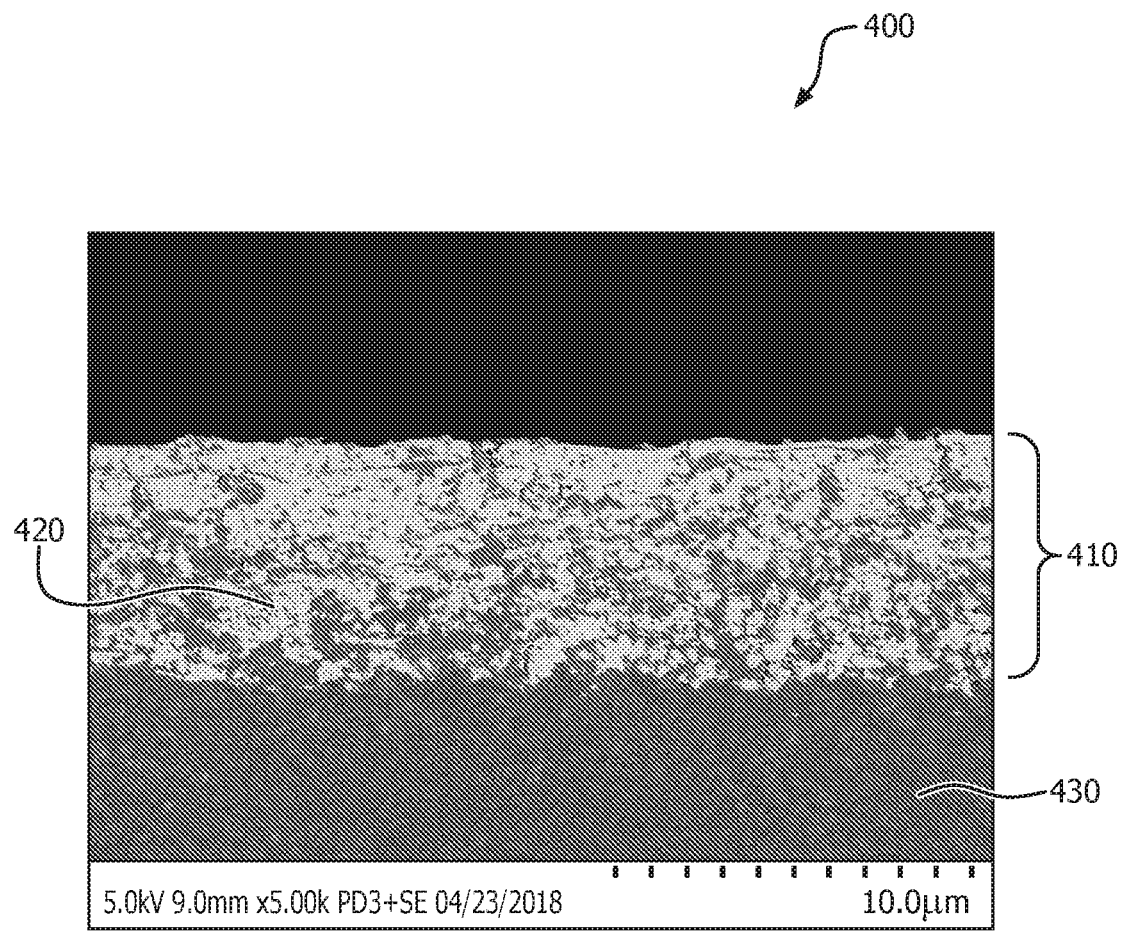
FIG. 7 is a scanning electron micrograph (SEM) of a portion of an expanded polytetrafluoroethylene membrane having imbibed therein a conductive trace according to at least one embodiment.

Once the substrate 610 contains thereon an adhesive, such as adhesive dots 620, the printed circuit 650 containing the synthetic polymer membrane 660 and conductive trace 670 is positioned over the substrate 610 and is attached to the substrate 610 via the adhesive dots 620, as is shown in FIG. 6B to form the conductive article 600. Non-conductive regions 640 are positioned adjacent to the imbibed conductive trace 670. In some embodiments, as shown in FIG. 6C, a printed circuit 650 containing conductive trace 670 and a synthetic polymer membrane 660 is positioned on one side of the substrate 610 and another printed circuit 651 containing conductive trace 671 and a synthetic polymer membrane 661 is positioned on the opposing side of the substrate. Non-conductive regions 640 are positioned adjacent to the imbibed conductive traces 670, 671. It is to be noted that the synthetic polymer membranes 670, 671 may be the same or different from each other. Also, the conductive traces 670, 671 may be the same or different from each other. FIG. 7 is a scanning electron micrograph (SEM) 400 of a portion of an exemplary expanded polytetrafluoroethylene membrane 410 positioned on an SEM mounting tape 430 having imbibed therein a conductive trace 420.

Although not depicted in any figure, it is to be appreciated that some conductive trace may be located on the surface of the porous synthetic polymer membrane as a consequence of the imbibing process. In embodiments where the conductive trace is applied via a liquid carrier (e.g. an electrically conductive ink) heat may be applied to the printed circuit to remove the liquid carrier. The temperature applied may be sufficient to at least partially fuse the conductive trace (e.g., metal particles) in the synthetic polymer membrane to form a continuous network of conductive particles. In other embodiments, heat may be used to remove ligands or other processing aids from the conductive particles.

In some embodiments, an insulating overcoat may be applied over the electrically conductive trace to assist in protecting the electrically conductive trace from external elements, such as, but not limited to, abrasion. Non-limiting examples of materials used to insulate the electrically conductive trace include urethanes (delivered as a solution), acrylics (delivered as a liquid), silicones, Styrene Isoprene Butadiene Block Copolymers, Viton™ FKM (a synthetic rubber and fluoropolymer elastomer), polyolefins, or fluoropolymers.

Advantageously, the conductive articles described herein are highly flexible, having a flexibility of less than 0.1 grams force-cm$^2$/cm as evidenced by the Kawabata test set forth below. In some embodiments, the conductive articles have a flexibility of less than 0.009 grams force-cm$^2$/cm, less than 0.008 grams force-cm$^2$/cm, less than 0.007 grams force-cm$^2$/cm, less than 0.006 grams force-cm$^2$/cm, less than 0.005 grams force-cm$^2$/cm, less than 0.004 grams force-cm$^2$/cm. Additionally, the imbibed porous synthetic polymer membranes are highly durable and are able to withstand multiple washings, as evidenced by the Wash Testing Durability test method described herein. The conductive articles are also highly breathable, having an MVTR of at least 2,000 as evidenced by the Moisture Vapor Transmission Rate (MVTR) test method described herein.

Test Methods

It should be understood that although certain methods and equipment are described below, other methods or equipment determined suitable by one of ordinary skill in the art may be alternatively utilized.

Resistance Measurement vs. Stretch

Figure 4:
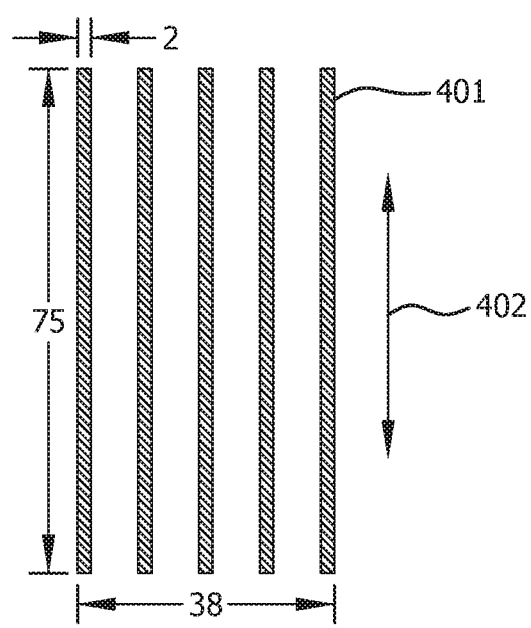
FIG. 4 is a graphical illustration of the arrangement and size of exemplary conductive traces used in Examples according to at least one embodiment.

A bucked textile containing thereon a printed circuit in the pattern depicted in FIG. 4 was were trimmed so that a single printed conductive line 401 shown in FIG. 4 was centered within a 15 mm wide strip. The strip was mounted in the grips of an INSTRON® model 5965, gripping the laminate so that there was a 5 mm gap between each end of the printed conductive line and the grip. The grips were moved apart until the force gauge registered between –0.1 newton and 0.1 newton. The gauge length was zeroed and the matching source and sense leads of a KEITHLY® 580 micro ohmmeter (Tektronix, Inc., Beaverton, Oreg., USA) were each connected to the two ends of the printed line 401. The sample was strained to 50% and then back to 0% at 60 mm/minute. Resistance was measured at 10% strain increments for both extension and compression phases of the test cycle.

ATEQ Airflow

ATEQ Airflow is a test method for measuring laminar volumetric flow rates of air through membrane samples. For each membrane, a sample was clamped between two plates in a manner that seals an area of 2.99 cm$^2$ across the flow pathway. An ATEQ® (ATEQ Corp., Livonia, Mich.) Premier D Compact Flow Tester was used to measure airflow rate (L/hr) through each membrane sample by challenging it with a differential air pressure of 1.2 kPa (12 mbar) through the membrane.

Gurley Airflow

The Gurley air flow test measures the time in seconds for 100 cm$^3$ of air to flow through 1 in$^2$ (~6.45 cm$^2$) sample at 0.177 psi (~1.22 kPa) of water pressure. The samples were measured in a GURLEY™ Densometer and Smoothness Tester Model 4340 (Gurley Precision Instruments, Troy, N.Y.). The values reported are an average of 3 measurements and are in the units are seconds.

Thickness

Figure 8A:
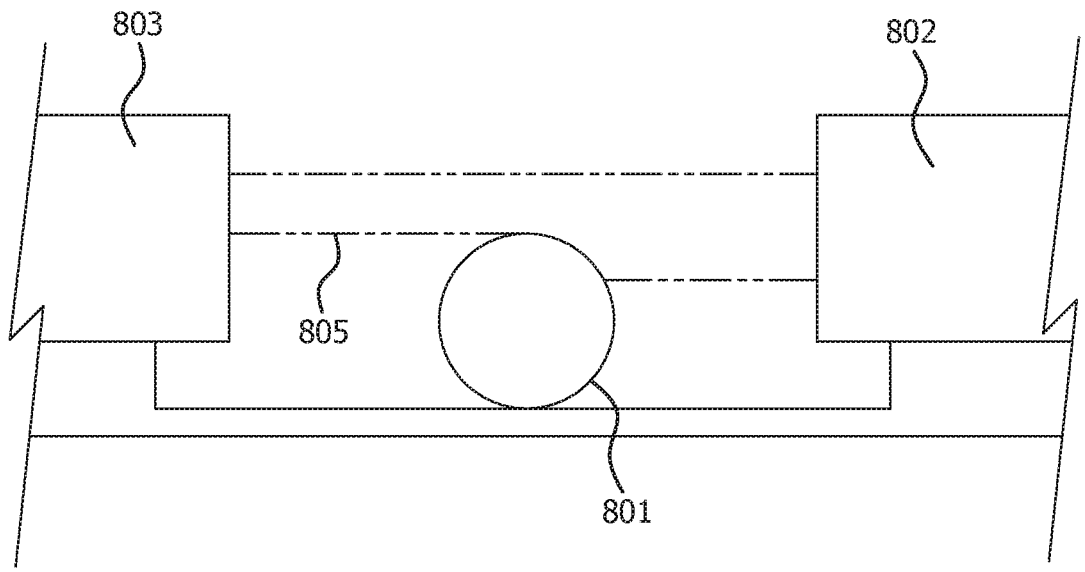
FIG. 8A is a schematic illustration of a metal cylinder aligned between a laser micrometer source and a laser micrometer receiver for measuring thickness of the synthetic polymer membrane when using a laser micrometer according to at least one embodiment.
Figure 8B:
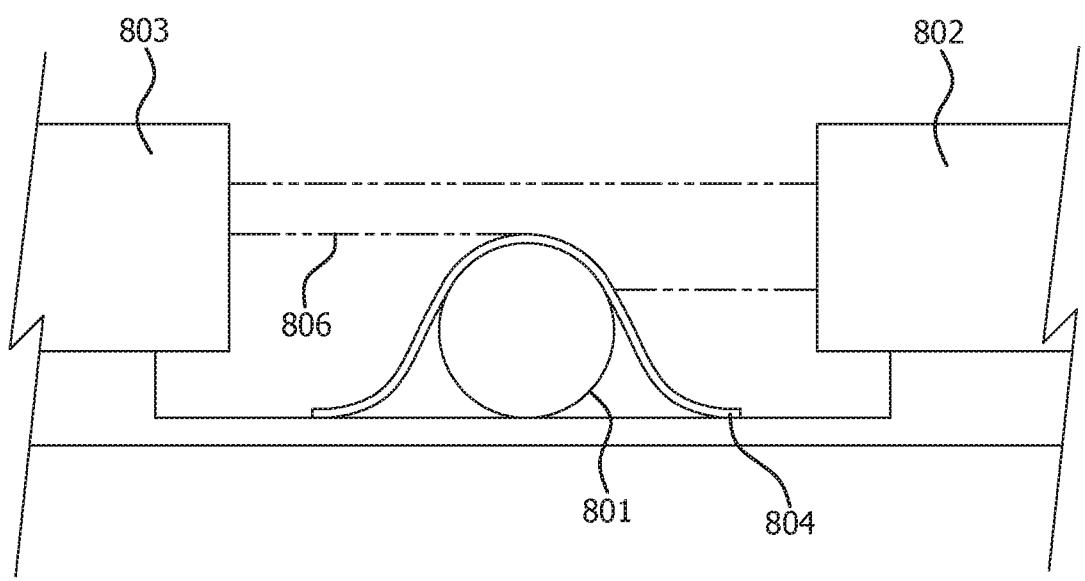
FIG. 8B is a schematic illustration of a single layer of membrane draped over the surface of the metal cylinder shown in FIG. 8A without overlap and without wrinkles when measuring the thickness of the synthetic polymer membrane when using a laser micrometer according to at least one embodiment.

Thickness was measured using a laser micrometer (Keyence model no. LS-7010, Mechelen, Belgium). As shown in FIGS. 8A and B, a metal cylinder 801 was aligned between a laser micrometer source 802 and a laser micrometer receiver 803. The shadow 805 of the top of the cylinder 801 is projected onto receiver 803 as shown in FIG. 8A. The position of the shadow was then reset as the "zero" reading of the laser micrometer. As shown in FIG. 8B, a single layer of membrane 804 is draped over the surface of the metal cylinder 801 without overlap and without wrinkles, casting shadow 806 onto the receiver 803. The laser micrometer then indicated the change in the position of the shadows 805 and 806 as the thickness of the sample. Each thickness was measured three times and averaged for each sample.

Mass Per Area (Mass/Area)

The mass per area of samples was measured according to the ASTM D 3776 (Standard Test Methods for Mass Per Unit Area (Weight) of Fabric) test method (Option C) using a Mettler-Toledo Scale, Model 1060. The scale was recalibrated prior to weighing specimens, and the results were reported in grams per square meter (g/m$^2$).

Wash Testing Durability

Wash testing was performed in a Kenmore washer (80-Series). The weight of the load was 1814.4±113.4 grams. The water level was 18±1 gallons (~68.1±3.79 L). The washer setting was 12 min Cotton Sturdy. The wash temperature was 120±5° F. (~48.9±2.78° C.). The laundry detergent was Original Tide powder (3700085006). The amount of soap was 11.0±0.1 grams. Drying was performed in a Kenmore 600 dryer. The dryer setting was Cotton Sturdy. The auto moisture sensing feature was set to Normal Dry, and ended the drying cycle when the samples were dry. One complete wash durability cycle consists of one wash cycle and one dry cycle. The resistance of each conductive trace was measured after 0, 1, 3, 6, 10, 15, and 20 cycles in the following manner: A KEITHLEY® 2750 multimeter system (Tektronix, Inc., Beaverton, Oreg., USA) was used to make 2-point probe measurements of DC resistance. The synthetic polymer membranes were laid flat to remove large wrinkles, but the substrates (i.e., fabrics) were left in their relaxed states (i.e., they were not stretched). Positive and negative probes were placed by hand on opposite ends of each trace and the value of resistance was recorded. The number of traces tested was 5. Wash testing durability was reported as the number of wash cycles before 50% of the traces exceeded 1 Megaohm (MΩ) resistance.

Moisture Vapor Transmission Rate (MVTR) Measurement

Approximately 70 mL of a solution consisting of 35 parts by weight of potassium acetate and 15 parts by weight of distilled water was placed into a 133 mL polypropylene cup having an inside diameter of 6.5 cm at its mouth. An expanded polytetrafluoroethylene (PTFE) membrane having a minimum MVTR of approximately 85,000 g/m$^2$/24 hr as tested by the method described in U.S. Pat. No. 4,862,730 to Crosby, was attached to the lip of the cup using a rubber band to create a taut, leak-proof, microporous barrier containing the potassium acetate solution.

A similar expanded PTFE membrane was mounted to the surface of a water bath. The water bath assembly was controlled at 23±0.2° C., utilizing a temperature controlled room and a water circulating bath.

The sample to be tested was allowed to condition at a temperature of 23° C. and a relative humidity of 50% prior to performing the test procedure. Samples were placed so that the conductive traces were facing away from the expanded polytetrafluoroethylene membrane mounted to the surface of the water bath and allowed to equilibrate for at least 15 minutes prior to the introduction of the cup assembly. The cup assembly was weighed to the nearest 1/1000 g and was placed in an inverted manner onto the center of the test sample.

Water transport was provided by the driving force between the water in the water bath and the saturated salt solution providing water flux by diffusion in that direction. The sample was tested for 15 minutes and the cup assembly was then removed and weighed again within 1/1000 g.

The MVTR of a sample was calculated from the weight gain of the cup assembly and was expressed in grams of water per square meter of sample surface area per 24 hours.

Matrix Tensile Strength Determination

A synthetic polymer membrane was cut in each of the longitudinal and transverse directions using an ASTM D412-Dogbone F. The "machine direction" is in the direction of the extrusion and the "transverse direction" is perpendicular to this. The membrane was placed on a cutting table such that the membrane was free from wrinkles in the area in which the membrane was to be cut. A die was then placed on the membrane (generally in the center 200 mm of the membrane) such that its long axis was parallel to the direction that would be tested. Once the die was aligned, pressure was applied to cut through the synthetic polymer membrane. Upon removal of the pressure, the dogbone sample was inspected to ensure it was free from edge defects which may impact the tensile testing. At least 3 samples in the machine direction and three samples in the transverse direction were prepared in this manner. Once the dogbone samples were prepared, they were measured to determine their mass using, a Mettler Toledo scale, model AG204.

Tensile break load was measured using an INSTRON® 5500R (Illinois Tool Works Inc., Norwood, Mass.) tensile test machine equipped with a rubber coated face plate and a serrated face plate such that each end of the sample was held between one rubber coated plate and one serrated plate. The pressure that was applied to the grip plates was approximately 552 kPa. The gauge length between the grips was set at 58.9 mm and the crosshead speed (pulling speed) was set to a speed of 508 mm/min. A 500 N load cell was used to carry out these measurements and data was collected at a rate of 50 points/sec. The laboratory temperature was between 20 and 22.2° C. to ensure comparable results. If the sample broke at the grip interface, the data was discarded. At least 3 samples in the machine direction and three samples in the transverse direction were successfully pulled (no slipping out of or breaking at the grips) in order to characterize the sample.

The following equation was used to calculate the matrix tensile strength:

$$MTS = ((F\,max/w)*p)/mass:area, \text{ in which:}$$

MTS=matrix tensile strength in MPa,
Fmax=maximum load measured during test (newtons),
w=width of dogbone sample within the gauge length (meters),
p=density of PTFE ($2.2 \times 10^6$ g/m³) or density of polyethylene (0.94 g/m³), and
mass:area=mass per area of the sample (g/m²).

Kawabata Flexibility Measurement

The low force bending behavior of the laminated sample was measured using a Kawabata Pure Bending Tester (KES-FB2-Auto-A; Kato Tech Co. LTD, Kyoto, Japan). The laminated sample was cut to a width of 7 cm with the printed pattern approximately centered and the printed lines running perpendicular to the 7 cm width. The sample was positioned within the grips of the bending tester so that the printed lines spanned the gap between the grips. The machine sensitivity was set to 10. The machine automatically tightened the grips and bent the laminated sample to a curvature of 2.5 cm⁻¹ in both directions while recording the applied load. The B-mean value reported is the average of the bending stiffness of the laminated sample when it was bent between 0.5 and 1.5 cm⁻¹ and −0.5 and −1.5 cm⁻¹. The bending stiffness is reported in grams force cm²/cm.

Bubble Point

Bubble point pressures were measured according to the general teachings of ASTM F31 6-03 using a Capillary Flow Porometer (Model 3Gzh from Quantachrome Instruments, Boynton Beach, Fla.). The sample membrane was placed into the sample chamber and wet with Silwick Silicone Fluid (available from Porous Materials Inc.) having a surface tension of 20.1 dynes/cm. The bottom clamp of the sample chamber had a 2.54 cm diameter, 0.159 cm thick porous metal disc insert (Quantachrome part number 75461 stainless steel filter) and was used to support the sample. Using the 3GWin software version 2.1, the following parameters were set as specified in the table immediately below. The values presented for bubble point pressure are the average of two measurements. Bubble point pressure was converted to pore size using the following equation:

$$D_{BP} = 4\gamma_{lv} \cos\Theta / P_{BP}$$

where $D_{BP}$ is the pore size, $\gamma_{lv}$ is the liquid surface tension, $\Theta$ is the contact angle of the fluid on the material surface, and $P_{BP}$ is the bubble point pressure. It is understood by one skilled in the art that the fluid used in a bubble point measurement must wet the surface of the sample.

| Bubble Point Instrument Settings | |
|---|---|
| Parameter | |
| Run Settings | |
| Starting pressure | 2.12 psig |
| Ending pressure | 85.74 psig |
| Sample Area | 3.14 cm² |
| Run Type | Wet Only |
| Number Data Points | 256 |
| Pressure Control | |
| Use Normal Equilibrium | TRUE |
| Use Tol | FALSE |
| Use Time | FALSE |
| Use Rate | FALSE |
| Use Low Flow Sensor | FALSE |
| Time Out | NA |
| Equil Time | NA |
| Run Rate | NA |
| Pressure Tolerance | NA |
| Flow Tolerance | NA |
| Smoothing | |
| UseMovAve | FALSE |
| MovAveWet Interval | NA |
| MovAveDry Interval | NA |
| Lowess Dry | 0.050 |
| Lowess Wet | 0.050 |
| Lowess Flow | 0.050 |
| Lowess Num | 0.100 |
| MinSizeThreshold | 0.98 |
| Bubble Point Parameters | |
| UseBpAuto | TRUE |
| UseBpThreshold (L/min) | FALSE |
| UseBpThreshold (Abs/cm2) | FALSE |
| UseBpThresholdNumber | FALSE |
| BpAutoTolerance (manual) | 1% |
| BpThresholdValue (manual) | NA |
| BpThreshold (abs/cm2) value | 0 | ePTFE Membranes ePTFE Membrane 1—Preparation ePTFE Membrane

An ePTFE membrane was manufactured according to the general teachings set forth in U.S. Patent Publication No.

2004/0173978 to Bowen et al. The ePTFE membrane had a mass-per-area of 4.6 g/m$^2$, a porosity of 87%, a non-contact thickness of 15.5 µm, a Gurley number of 4.5 seconds, an ATEQ air flow of 17 liters/cm$^2$/hour at 12 mbar, a matrix tensile strength of 258 MPa in the machine direction, a matrix tensile strength of 329 MPa in the transverse direction, a specific surface area of 14.520 m$^2$/g, and a surface area per volume of 31.944 m$^2$/cm$^3$. A scanning electron microscope (SEM) image of the ePTFE membrane is shown in FIG. 1.

ePTFE Membrane 2—Preparation ePTFE Membrane

Figure 2:
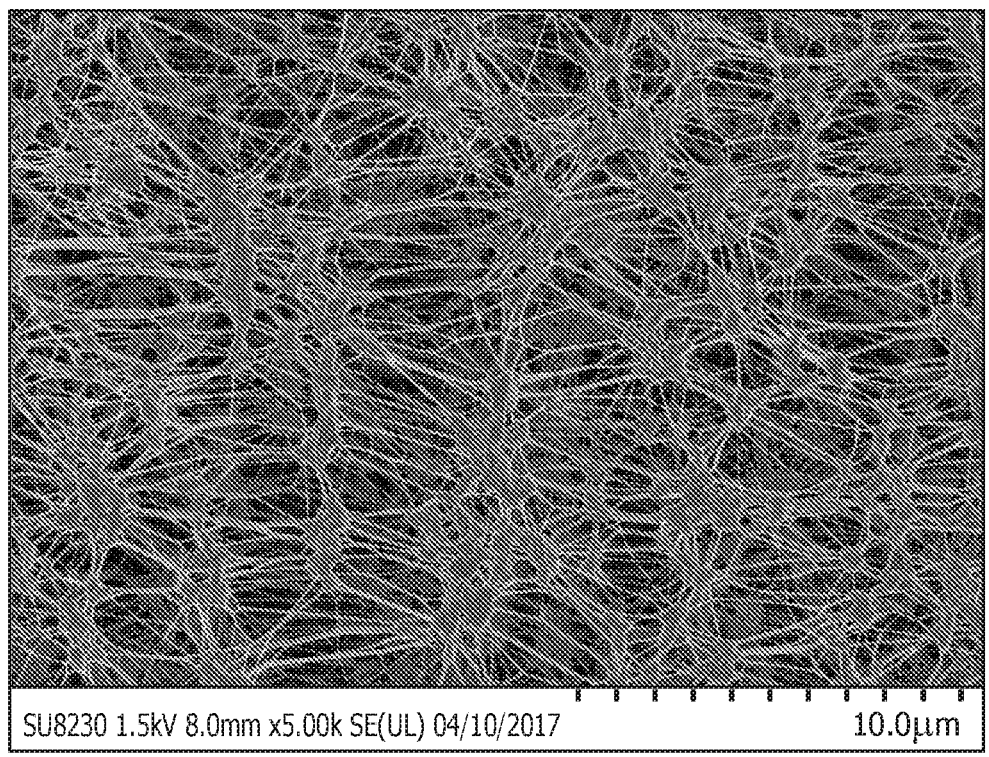
FIG. 2 is an SEM of a porous expanded polytetrafluoroethylene (ePTFE) membrane (Membrane 2) according to at least one embodiment.

An ePTFE membrane was manufactured according to the general teachings set forth in U.S. Pat. No. 3,953,566 to Gore. The ePTFE membrane had a mass-per-area of 16.6 g/m$^2$, a porosity of 80%, a non-contact thickness of 37.6 µm, a bubble point of 156 kPa, a matrix tensile strength of 42.4 MPa in the machine direction, a matrix tensile strength of 116.4 MPa in the transverse direction, a specific surface area of 7.891 m$^2$/g and a surface area per volume of 17.75 m$^2$/cm$^3$. An SEM image of the ePTFE membrane is shown in FIG. 2.

EXAMPLES

The invention of this application has been described above both generically and with regard to specific embodiments. It will be apparent to those skilled in the art that various modifications and variations can be made in the embodiments without departing from the scope of the disclosure. Thus, it is intended that the embodiments cover the modifications and variations of this invention provided they come within the scope of the appended claims and their equivalents.

Example 1

Expanded polytetrafluoroethylene (ePTFE) (Membrane 1) was used as the substrate for imbibing. The ePTFE membrane was restrained by laying it over a 6-inch (~15.24 cm) diameter aluminum hoop, fixing it to the hoop by placing a stainless steel spring around the circumference, and tensioning the substrate by hand to remove wrinkles. To support the ePTFE membrane during adhesion of the stencil, the hoop restraining the ePTFE membrane was placed over a clean DELRIN® disc (an acetal homopolymer resin available from DowDuPont, Wilmington, Del.) that was machined to fit inside the hoop (the disc provided a clean surface that contacted the "bottom" of the ePTFE substrate).

To prepare the stencil, a piece of tape (Scapa Type 536; a polyester film, single coated with an acrylic adhesive; Scapa North America, Windsor, Conn.) was transferred to release paper. A laser cutter (PLS6.75 laser cutter, Universal Laser, Scottsdale, Ariz.) was used to cut holes into the tape to form the pattern depicted in FIG. 4. The dimensions provided in FIG. 4 are in millimeters (mm) and indicate the size of the pattern applied. The double-ended arrow 402 is shown to illustrate the alignment of the stretch textile with the flexible circuit. The tape stencil was then removed from the release paper and pressed by hand to the surface of the exposed "top" surface of the ePTFE membrane to firmly adhere the stencil to the ePTFE membrane. The stencil and the ePTFE membrane, still restrained on the hoop, were then removed from the DELRIN® disc and placed in a laboratory fume hood for imbibing.

Conductive Ink Imbibing

An excess of conductive ink (2108-IPA; an ink formulation including stably dispersed silver nanoparticles, available from Nanogap Inc., Richmond, Calif.) was pipetted onto the top surface of the ePTFE membrane through the holes in the stencil. When this process was complete, the top surface was thoroughly wiped with a single ply cellulose wipe (Delicate Task Wiper; KIMWIPES®; Kimberly-Clark, Roswell, Ga.) to remove any excess ink. The tape stencil was then promptly removed. Removal of the stencil also removed a portion of the upper surface of the substrate that was adhered to the stencil, but the amount removed was considered negligible. The imbibed ePTFE membrane, still restrained in the hoop, was then allowed to air dry in the hood for at least 10 minutes, and then heat-treated in a hot air convection oven for 60 minutes at 200° C.

Bonding Adhesive Dots to a Stretch Textile

UT polyurethane thermoplastic adhesive (Protechnic, Cernay France) was printed onto release paper using an 18Q236 gravure pattern. A nylon/polyester/elastane blend, twill weave, warp direction stretch textile (TD36B, Formosa Chemicals and Fibre Corporation, Taipei, Taiwan) was stretched in the warp direction to about 2 times its relaxed length and restrained in a rectangular frame. A 112 mm×152 mm sheet of the polyurethane adhesive printed release paper was positioned on the textile and heat laminated to the textile by pressing it in a T-shirt press at 135° C. for approximately 5 seconds. Once cooled, the release paper was removed, leaving the polyurethane adhesive dots bonded to the stretch textile.

Preparation of Structured ("Buckled") Laminate

The ePTFE membrane with the imbibed conductive trace (i.e., the printed circuit) was trimmed to 128 mm×78 mm with the printed pattern approximately centered. The printed circuit was then centered on top of the adhesive dots that were bonded to the textile, aligning arrow 402 in FIG. 4 with the warp direction of the textile. The printed circuit was then heat laminated to the textile by pressing it in a T-shirt press at 135° C. for approximately 5 seconds. After cooling, the textile was released from the frame and allowed to return to its relaxed state thereby compressing and buckling the printed circuit with the textile (conductive article).

Resistance Measurement v. Stretch

Figure 5:
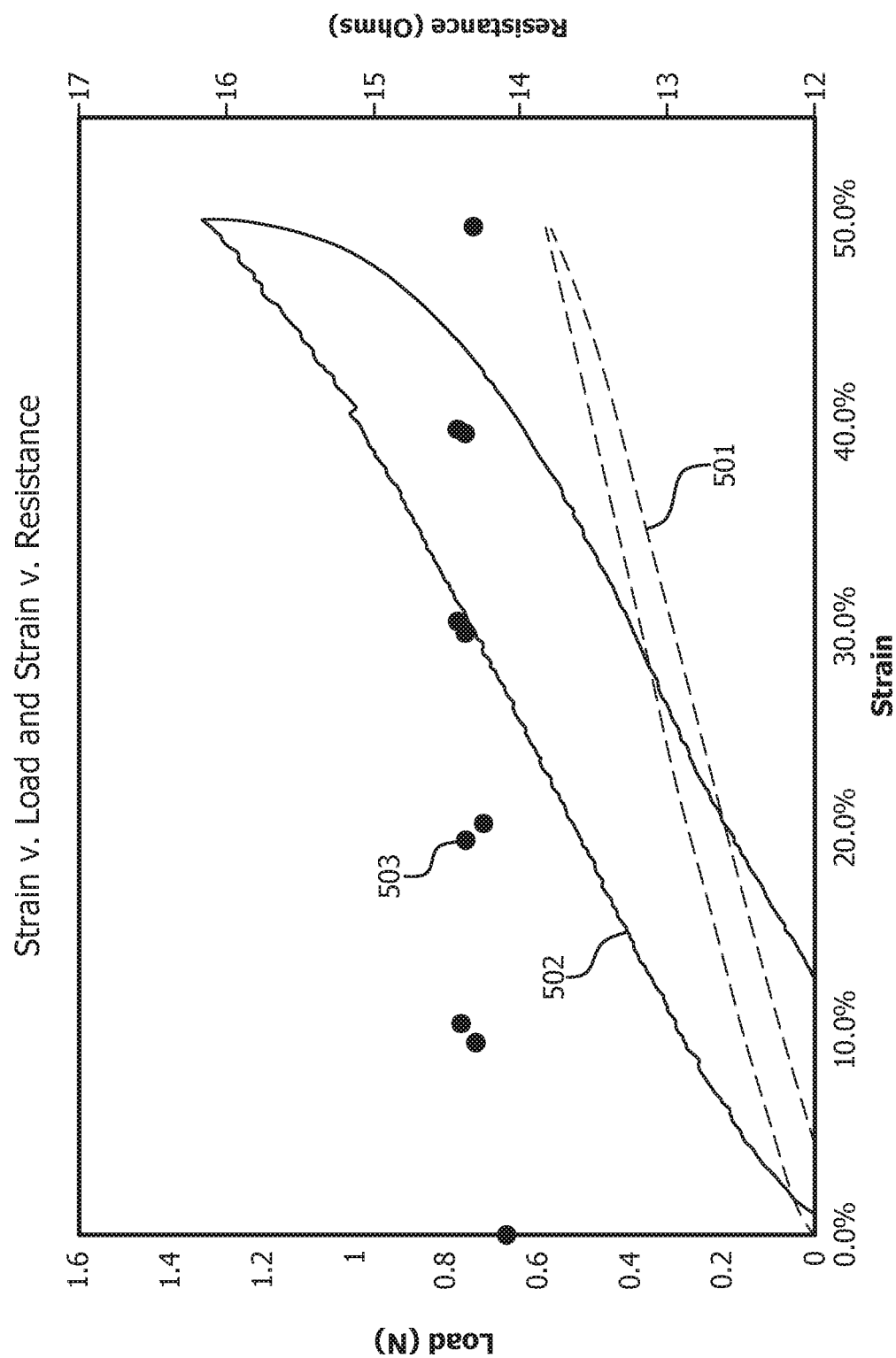
FIG. 5 is a graphical illustration of the strain v. load and strain v. resistance for several materials tested in Example 1 according to at least one embodiment.

Resistance Measurement v. Stretch testing was performed as described in the test method set forth above. The results of this resistance testing are presented in FIG. 5 and Table 1. Discontinuous curve 501 shows the load-strain relationship of the unlaminated textile, while continuous curve 502 shows the load-strain relationship of the flexible article as each sample was stretched to 50% strain and returned to 0% strain. Both are read on the primary y-axis. Circular markers 503 show the resistance in ohms of the conductive trace of the laminated sample with respect to strain, and is read on the secondary y-axis. It was determined that the resistance of the printed circuit remained substantially unchanged as the flexible circuit was elongated to 50% strain.

Wash Testing

Wash testing durability was performed as described in the test method set forth above. It was determined that the printed circuit survived at least 20 wash cycles before 50% of the traces exceeded 1 Megaohm (MΩ).

MTVR

The moisture vapor transmission rate was measured as described in the test method set forth above. The MVTR was measured to be 15680 g/m$^2$/24 hours (Table 1).

Kawabata Testing

Kawabata bend testing was performed as described in the test method set forth above. The Kawabata bend test value was measured as 0.0418 grams force-cm$^2$/cm.

Example 2

Expanded polytetrafluoroethylene (ePTFE) (Membrane 1) was used as the substrate for printing. The ePTFE membrane was restrained in a 356 mm diameter embroidery hoop, tensioned to remove wrinkles, and screen-printed using conductive ink in the pattern shown in FIG. 4. The dimensions shown in FIG. 4 are in mm and indicate the size of the pattern applied. The double ended arrow 402 is shown to illustrate the alignment of the substrate with the flexible circuit. The screen printing was performed using a model MSP-088 screen printer (HMI Manufacturing, Lebanon, N.J.) and a stainless steel screen with 200 TPI (threads/wire per inch; ~78,74 wires per cm), 1.6 mil (~40.64 µm) wire diameter, and a 12.7 µm emulsion. The conductive ink used was CI1036 (a highly conductive silver ink; total solids content 66%; Engineered Conductive Materials, Delaware, Ohio). The ink was dried in a convection oven at 120° C. for 20 minutes. The printed circuit was removed from the embroidery hoop by trimming the substrate to 128 mm×78 mm with the printed pattern approximately centered on the ePTFE membrane.

The process of bonding polyurethane adhesive dots to a stretch textile followed the process described in Example 1. The stretch textile was the same as that used in Example 1.

Preparation of a structured ("buckled") ePTFE laminate followed the process described in Example 1 to adhere the printed circuit to the stretch textile (e.g., conductive article).

Resistance Measurement v. Stretch

Resistance Measurement v. Stretch testing was performed as described in the test method set forth above. The resistance of the circuit remained substantially unchanged as the flexible circuit was elongated to 50% strain.

Wash Testing

Wash testing durability was performed as described in the test method set forth above. It was determined that the printed circuit survived 3 wash cycles before 50% of the traces exceeded 1 Megaohm (MΩ) (Table 1).

MTVR

The moisture vapor transmission rate of the flexible circuit was measured as described in the test method set forth above. The MVTR was measured to be 16085 $g/m^2/24$ hours (Table 1).

Kawabata Testing

Kawabata bend testing was performed as described in the test method set forth above. The Kawabata bend test value was measured as 0.0364 grams force-$cm^2$/cm.

Example 3

Expanded polytetrafluoroethylene (ePTFE) (Membrane 2) was used as the substrate for printing. The ePTFE membrane was restrained in a 356 mm diameter embroidery hoop, tensioned to remove wrinkles, and screen-printed using conductive ink in the pattern shown in FIG. 4. The dimensions shown in FIG. 4 are in mm and shown for reference and indicate the size of the pattern applied. The double ended arrow 402 is shown to illustrate the alignment of the substrate with the flexible circuit. The screen printing was performed using a model MSP-088 screen printer (HMI Manufacturing, Lebanon, N.J.) and a stainless steel screen with 200 TPI (threads/wire per inch; ~78,74 wires per cm), 1.6 mil (~40.64 µm) wire diameter, and a 12.7 µm emulsion. The conductive ink used was CI1036 (a highly conductive silver ink; total solids content 66%; Engineered Conductive Materials, Delaware, Ohio). The ink was dried in a convection oven at 120° C. for 20 minutes. The printed ePTFE membrane was removed from the embroidery hoop by trimming the substrate to 128 mm×78 mm with the printed pattern approximately centered on the ePTFE membrane.

The process of bonding adhesive dots to a stretch textile followed the process described in Example 1. The textile was the same as that used in Example 1.

Preparation of a structured ("buckled") ePTFE laminate followed the process described in Example 1 to adhere the flexible circuit to the stretch textile.

Resistance Measurement v. Stretch

Resistance Measurement v. Stretch testing was performed as described in the test method set forth above. The resistance of the circuit remained substantially unchanged as the flexible circuit was elongated to 50% strain.

Wash Testing

Wash testing durability was performed as described in the test method set forth above. It was determined that the printed circuit survived 3 wash cycles before 50% of the traces exceeded 1 Megaohm (MΩ) (Table 1).

MTVR

The moisture vapor transmission rate of the flexible circuit was measured as described in the test method set forth above. The MVTR was measured to be 14263 $g/m^2/24$ hours (Table 1).

Kawabata Testing

Kawabata bend testing was performed as described in the test method set forth above. The Kawabata bend test value was measured as 0.0348 grams force-$cm^2$/cm.

Example 4

A commercially available 25 µm thick thermoplastic polyurethane film (TPU), DUREFLEX® PT1710S, (Covestro LLC, Whately, Mass.) was obtained. The TPU film was restrained in a 356-mm diameter embroidery hoop, tensioned to remove wrinkles, and screen-printed using conductive ink in the pattern depicted in FIG. 4. The dimensions shown in FIG. 4 are in mm and shown for reference and indicate the size of the pattern applied. The double ended arrow 402 is shown to illustrate the alignment of the substrate with the flexible circuit.

The screen printing was performed using a model MSP-088 screen printer (HMI Manufacturing, Lebanon, N.J.) and a stainless steel screen with 200 TPI (threads/wire per inch; ~78,74 wires per cm), 1.6 mil (~40.64 µm) wire diameter, and a 12.7 µm emulsion. The conductive ink used was CI1036 (a highly conductive silver ink; total solids content 66%; Engineered Conductive Materials, Delaware, Ohio). The ink was dried in a convection oven at 120° C. for 20 minutes. The printed substrate was removed from the embroidery hoop by trimming the substrate to 128 mm×78 mm with the printed pattern approximately centered in the UTP film.

The process of bonding adhesive dots to a stretch textile followed the process described in Example 1. The textile was the same as that of Example 1.

Preparation of structured ("buckled") laminate followed the process described in Example 1 to adhere the flexible circuit to the stretch textile.

Resistance Measurement v. Stretch

Resistance Measurement v. Stretch testing was performed as described in the test method set forth above. The resistance of the circuit remained substantially unchanged as the flexible circuit was elongated to 50% strain.

Wash Testing

Wash testing durability was performed as described in the test method set forth above. It was determined that the printed circuit survived 1 wash cycle before 50% of the traces exceeded 1 Megaohm (MΩ) (Table 1).

MTVR

The moisture vapor transmission rate of the flexible circuit was measured as described in the test method set forth above. The MVTR was measured to be 2459 g/m$^2$/24 hours (Table 1).

Kawabata Testing

Kawabata bend testing was performed as described in the test method set forth above. The Kawabata bend test value was measured as 0.0527 grams force-cm$^2$/cm.

Example 5

Figure 3:
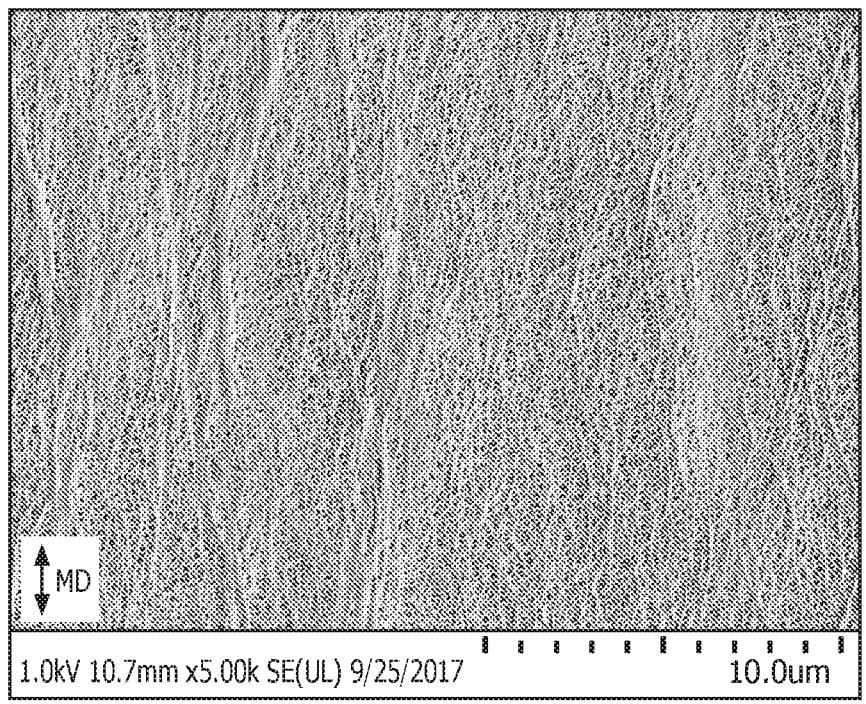
FIG. 3 is an SEM of a porous polyethylene membrane utilized in Example 5 according to at least one embodiment.

A 12 μm thick porous polyethylene lithium ion battery separator, (T3, Pair Materials Co. Ltd, Dongguan, China) was obtained. The polyethylene membrane had a mass-per-area of 7.0 g/m$^2$, a porosity of 40%, a thickness of 12.4 μm, a bubble point of 1543 kPa, a matrix tensile strength of 314 MPa in the machine direction, a matrix tensile strength of 233 MPa in the transverse direction, a specific surface area of 34.1 m$^2$/g and a surface area per volume of 32.1 m$^2$/cm$^3$. An SEM image of the polyethylene membrane is shown in FIG. 3.

The polyethylene film was restrained in a 356-mm diameter embroidery hoop, tensioned to remove wrinkles, and screen-printed using conductive ink in the pattern shown in FIG. 4. The dimensions shown in FIG. 4 are in mm and shown for reference and indicate the size of the pattern applied. The double ended arrow 402 in FIG. 4 is shown to illustrate the alignment of the substrate with the flexible circuit. Screen printing was performed using a model MSP-088 screen printer (HMI Manufacturing, Lebanon, N.J.) and a stainless steel screen with 200 TPI (threads/wire per inch; ~78.74 wires per cm), 1.6 mil (~40.64 μm) wire diameter, 12.7 μm emulsion. The conductive ink used was CI1036 (a highly conductive silver ink; total solids content 66%; Engineered Conductive Materials, Delaware, Ohio). The ink was dried in a convection oven at 120° C. for 20 minutes. The printed polyethylene film was removed from the embroidery hoop by trimming the polyethylene film to 128 mm×78 mm with the printed pattern approximately centered in the polyethylene film (printed circuit).

The process of bonding adhesive dots to a stretch textile followed the process described in Example 1. The textile was the same as that used in Example 1.

Preparation of structured ("buckled") laminate followed the process described in Example 1 to adhere the flexible circuit to the stretch textile.

Resistance Measurement v. Stretch

Resistance Measurement v. Stretch testing was performed as described in the test method set forth above. The resistance of the circuit remained substantially unchanged as the flexible circuit was elongated to 50% strain.

Wash Testing

Wash testing durability was performed as described in the test method set forth above. It was determined that the printed circuit survived 3 wash cycles before 50% of the traces exceeded 1 Megaohm (MΩ) (Table 1).

MTVR

The moisture vapor transmission rate of the flexible circuit was measured as described in the test method set forth above. The MVTR was measured to be 9721 g/m$^2$/24 hours (Table 1).

Kawabata Testing

Kawabata bend testing was performed as described in the test method set forth above. The Kawabata bend test value was measured as 0.0970 grams force-cm$^2$/cm.

Example 6

Expanded polytetrafluoroethylene (ePTFE) membrane (Membrane 1) was used as the substrate. To prepare the ePTFE membrane for imbibing, the ePTFE membrane was restrained by laying it over a 6-inch diameter aluminum hoop, fixing it to the hoop by placing a stainless steel spring around the circumference, and tensioning the ePTFE membrane to remove wrinkles. To support the ePTFE membrane during adhesion of the stencil, the hoop restraining the ePTFE membrane was placed over a clean DELRIN® (an acetal homopolymer resin available from DowDuPont, Wilmington, Del.) disc that was machined to fit inside the hoop, and which provided a clean surface that contacted the "bottom" of the ePTFE membrane. To prepare the stencil, a piece of tape (Scapa Type 536; a polyester film, single coated with an acrylic adhesive; Scapa North America, Windsor, Conn.) was transferred to release paper, and a laser cutter (PLS6.75 laser cutter, Universal Laser, Scottsdale, Ariz.) was used to cut holes in the tape stencil in the pattern shown in FIG. 4. The dimensions shown in FIG. 4 are in mm and are shown to indicate the size of the pattern.

The tape stencil was then removed from the release paper and pressed by hand to the surface of the exposed "top" surface of the ePTFE membrane to firmly adhere it to the ePTFE membrane. The stencil and ePTFE membrane, still restrained on the hoop, were then removed from the DELRIN® disc and placed in a laboratory fume hood for imbibing. An excess of conductive ink (2108-IPA available from Nanogap, Inc.) was pipetted onto the top surface of the ePTFE membrane through the holes in the tape stencil. When this process was complete, the top surface of the stencil/ePTFE membrane was thoroughly wiped with a Kimwipe (Kimberly Clark, Delicate Task Wiper, 1-ply) to remove any excess ink. The tape stencil was then promptly removed. Removal of the stencil also removed a portion of the upper surface of the ePTFE membrane that was adhered to the stencil, but the amount was considered negligible. The imbibed ePTFE membrane (printed circuit), still restrained in the hoop, was then allowed to air dry in the hood for at least 10 minutes, and then heat-treated in a hot air convection oven for 60 minutes at 200° C.

UT polyurethane thermoplastic adhesive (Protechnic, Cernay France) was printed onto release paper using an 18Q236 gravure pattern. A nylon/polyester/elastane blend, twill weave, warp direction stretch textile (TD36B, Formosa Chemicals and Fibre Corporation, Taipei, Taiwan) was restrained in a rectangular frame with the fabric in a non-stretched (relaxed) state. A 112 mm×152 mm sheet of adhesive printed release paper was positioned on the textile and heat laminated to the textile by pressing the release paper and textile in a T-shirt press at 135° C. for approximately 5 seconds. Once cooled, the release paper was removed, leaving adhesive dots bonded to the textile. To adhere the printed circuit to the textile, the printed circuit was first trimmed to 128 mm×78 mm with the printed pattern approximately centered on the adhesive dots bonded to the textile, aligning arrow 402 in FIG. 4 with the warp direction of the textile. The printed circuit was then heat laminated to the textile by pressing the textile containing the printed circuit in a T-shirt press at 135° C. for approximately 5 seconds. After cooling, the textile was released from the frame.

Resistance Measurement v. Stretch

Resistance Measurement v. Stretch testing was performed as described in the test method set forth above. The resistance of the printed circuit increased significantly as the flexible circuit was elongated to 50% strain.

Wash Testing

Wash testing durability was performed as described in the test method set forth above. It was determined that the sample survived 6 wash cycles before 50% of the traces exceeded 1 Megaohm (MΩ) (Table 1).

MTVR

The moisture vapor transmission rate of the flexible circuit was measured as described in the test method set forth above. The MVTR was measured to be 17127 g/m$^2$/24 hours (Table 1).

Kawabata Testing

Kawabata bend testing was performed as described in the test method set forth above. The Kawabata bend test value was measured as 0.0669 grams force-cm$^2$/cm.

Example 7

Expanded polytetrafluoroethylene (ePTFE) membrane (Membrane 1) was used as the substrate. The ePTFE membrane was restrained in a 356 mm diameter embroidery hoop, tensioned to remove wrinkles, and screen-printed using conductive ink in the pattern shown in FIG. 4. The dimensions shown in FIG. 4 are in mm and shown for reference and indicate the size of the pattern applied. Screen printing was performed using a model MSP-088 screen printer (HMI Manufacturing, Lebanon, N.J.) and a stainless steel screen with 200 TPI (threads/wire per inch; ~78,74 wires per cm), 1.6 mil (~40.64 μm) wire diameter, and a 12.7 μm emulsion. The conductive ink used was CI1036 (a highly conductive silver ink; total solids content 66%; Engineered Conductive Materials, Delaware, Ohio). The ink was dried in a convection oven at 120° C. for 20 minutes. The printed ePTFE membrane was removed from the embroidery hoop by trimming the ePTFE membrane to 128 mm×78 mm with the printed pattern approximately centered on the ePTFE membrane.

UT polyurethane thermoplastic adhesive (Protechnic, Cernay France) was printed onto release paper using an 18Q236 gravure pattern. A nylon/polyester/elastane blend, twill weave, warp direction stretch textile (TD36B, Formosa Chemicals and Fibre Corporation, Taipei, Taiwan) was restrained in a rectangular frame with the fabric in a non-stretched (relaxed) state. A 112 mm×152 mm sheet of adhesive printed release paper was positioned on the textile and heat laminated to the textile by pressing the release paper and textile in a T-shirt press at 135° C. for approximately 5 seconds. Once cooled, the release paper was removed, leaving adhesive dots bonded to the textile. To adhere the printed circuit to the textile, the printed circuit was first trimmed to 128 mm×78 mm with the printed pattern approximately centered on the adhesive dots bonded to the textile, aligning arrow 402 in FIG. 4 with the warp direction of the textile. The printed circuit was then heat laminated to the textile by pressing the textile containing the printed circuit in a T-shirt press at 135° C. for approximately 5 seconds. After cooling, the textile was released from the frame.

Resistance Measurement v. Stretch

Resistance Measurement v. Stretch testing was performed as described in the test method set forth above. The resistance of the circuit increased significantly as the flexible circuit was elongated to 50% strain.

Wash Testing

Wash testing durability was performed as described in the test method set forth above. It was determined that the sample survived 1 wash cycle before 50% of the traces exceeded 1 Megaohm (MΩ) (Table 1).

MTVR

The moisture vapor transmission rate of the flexible circuit was measured as described in the test method set forth above. The MVTR was measured to be 16259 g/m$^2$/24 hours (Table 1).

Kawabata Testing

Kawabata bend testing was performed on the flexible circuit as described in the test method set forth above. The Kawabata bend test value was measured as 0.0544 grams force-cm$^2$/cm.

Example 8

A 25 μm thick thermoplastic polyurethane film (TPU), DUREFLEX® PT1710S, (Covestro LLC, Whately, Mass.) was obtained. The TPU film was restrained in a 356-mm diameter embroidery hoop, tensioned to remove wrinkles, and screen-printed using conductive ink in the pattern shown in FIG. 4. The dimensions shown in FIG. 4 are in mm and indicate the size of the pattern applied. The double ended arrow 402 is shown to illustrate the alignment of the substrate with the flexible circuit.

Screen printing was performed using a model MSP-088 screen printer (HMI Manufacturing, Lebanon, N.J.) and a stainless steel screen with 200 TPI (threads/wire per inch; ~78,74 wires per cm), 1.6 mil (~40.64 μm) wire diameter, and a 12.7 μm emulsion. The conductive ink used was CI1036 (a highly conductive silver ink; total solids content 66%; Engineered Conductive Materials, Delaware, Ohio). The ink was dried in a convection oven at 120° C. for 20 minutes. The printed TPU film was removed from the embroidery hoop by trimming the substrate to 128 mm×78 mm with the printed pattern approximately centered.

UT polyurethane thermoplastic adhesive (Protechnic, Cernay France) was printed onto release paper using an 18Q236 gravure pattern. A nylon/polyester/elastane blend, twill weave, warp direction stretch textile (TD36B, Formosa Chemicals and Fibre Corporation, Taipei, Taiwan) was restrained in a rectangular frame with the fabric in a non-stretched (relaxed) state. A 112 mm×152 mm sheet of adhesive printed release paper was positioned on the textile and heat laminated to the textile by pressing the release paper and textile in a T-shirt press at 135° C. for approximately 5 seconds. Once cooled, the release paper was removed, leaving adhesive dots bonded to the textile. To adhere the printed circuit to the textile, the printed circuit was first trimmed to 128 mm×78 mm with the printed pattern approximately centered on the adhesive dots bonded to the textile, aligning arrow 402 in FIG. 4 with the warp direction of the textile. The printed circuit was then heat laminated to the textile by pressing the textile containing the printed circuit in a T-shirt press at 135° C. for approximately 5 seconds. After cooling, the textile was released from the frame.

Resistance Measurement v. Stretch

Resistance Measurement v. Stretch testing was performed as described in the test method set forth above. The resistance of the printed circuit increased significantly as the laminate was elongated to 50% strain.

Wash Testing

Wash testing durability was performed as described in the test method set forth above. The printed circuit survived 1 wash cycle before 50% of the traces exceeded 1 Megaohm (MΩ) (Table 1).

MTVR

The moisture vapor transmission rate of the flexible circuit was measured as described in the test method set forth above. The MVTR was measured to be 1852 g/m$^2$/24 hours (Table 1).

Kawabata Testing

Kawabata bend testing of the flexible circuit was performed as described in the test method set forth above. The Kawabata bend test value was measured as 0.0710 grams force-cm$^2$/cm.

Example 9

Expanded polytetrafluoroethylene (ePTFE) (Membrane 1) was used as substrate. The ePTFE membrane was prepared for imbibing as described in the Test Methods above in the section entitled "Preparation of Imbibed Substrates". The ePTFE membrane was imbibed with the pattern shown in FIG. 4 to form the printed circuit.

UT polyurethane thermoplastic adhesive (Protechnic, Cernay France) was printed onto release paper using an 18Q236 gravure pattern. A 91 g/m$^2$ non-stretch, nylon woven material (Style 131859, (MI 270) from Milliken and Company, Spartanburg, S.C.) was restrained in a rectangular frame with just enough tension to remove any wrinkles. A 112 mm×152 mm sheet of adhesive printed release paper was positioned on the textile and heat laminated to the textile by pressing the textile and release paper in a T-shirt press at 135° C. for approximately 5 seconds. Once cooled, the release paper was removed, leaving the adhesive dots bonded to the textile. To adhere the printed circuit to the textile, the ePTFE membrane was first trimmed to 128 mm×78 mm with the printed pattern approximately centered. The printed circuit was centered on top of the adhesive dots that were bonded to the textile, aligning arrow 402 in FIG. 4 with the warp direction of the textile. The printed circuit was then heat laminated to the textile by pressing it in a T-shirt press at 135° C. for approximately 5 seconds. After cooling, the textile was released from the frame.

Resistance Measurement v. Stretch

Resistance Measurement v. Stretch testing was performed as described in the test method set forth above. The resistance of the circuit increased significantly as the flexible circuit was elongated to 50% strain.

Wash Testing

Wash testing durability was performed as described in the test method set forth above. It was determined that the sample survived 10 wash cycles before 50% of the traces exceeded 1 Megaohm (MΩ) (Table 1).

MTVR

The moisture vapor transmission rate of the flexible circuit was measured as described in the test method set forth above. The MVTR was measured to be 21119 g/m$^2$/24 hours (Table 1).

Kawabata Testing

Kawabata bending testing of the flexible circuit was performed as described in the test method set forth above. The Kawabata bend test value was measured as 0.0607 grams force-cm$^2$/cm.

Example 10

Expanded polytetrafluoroethylene (ePTFE) (Membrane 1) was used as the substrate. The ePTFE membrane was restrained in a 356 mm diameter embroidery hoop, tensioned to remove wrinkles, and screen-printed using conductive ink in the pattern shown in FIG. 4. The dimensions shown in FIG. 4 are in mm and indicate the size of the pattern applied. The double ended arrow 402 is shown to illustrate the alignment of the substrate with the flexible circuit. The screen printing was performed using a model MSP-088 screen printer (HMI Manufacturing, Lebanon, N.J.) and a stainless steel screen with 200 TPI (threads/wire per inch; ~78,74 wires per cm), 1.6 mil (~40.64 μm) wire diameter, and a 12.7 μm emulsion. The conductive ink used was CI1036 (a highly conductive silver ink; total solids content 66%; Engineered Conductive Materials, Delaware, Ohio). The ink was dried in a convection oven at 120° C. for 20 minutes. The printed substrate was removed from the embroidery hoop by trimming the substrate to 128 mm×78 mm with the printed pattern approximately centered on the ePTFE membrane.

UT polyurethane thermoplastic adhesive (Protechnic, Cernay France) was printed onto release paper using an 18Q236 gravure pattern. A 91 g/m$^2$ non-stretch, nylon woven material (Style 131859, (MI 270) from Milliken and Company, Spartanburg, S.C.) was restrained in a rectangular frame with just enough tension to remove any wrinkles. A 112 mm×152 mm sheet of adhesive printed release paper was positioned on the textile and heat laminated to the textile by pressing the textile and release paper in a T-shirt press at 135° C. for approximately 5 seconds. Once cooled, the release paper was removed, leaving the adhesive dots bonded to the textile. To adhere the printed circuit to the textile, the ePTFE membrane was first trimmed to 128 mm×78 mm with the printed pattern approximately centered. The printed circuit was centered on top of the adhesive dots that were bonded to the textile, aligning arrow 402 in FIG. 4 with the warp direction of the textile. The printed circuit was then heat laminated to the textile by pressing it in a T-shirt press at 135° C. for approximately 5 seconds. After cooling, the textile was released from the frame.

Resistance Measurement v. Stretch

Resistance Measurement v. Stretch testing was performed as described in the test method set forth above. The resistance of the circuit increased significantly as the flexible circuit was elongated to 50% strain.

Wash Testing

Wash testing durability was performed as described in the test method set forth above. The sample survived 1 wash cycle before 50% of the traces exceeded 1 Megaohm (MΩ) (Table 1).

MTVR

The moisture vapor transmission rate was measured as described in the test method set forth above. The MVTR was measured to be 19239 g/m$^2$/24 hours (Table 1).

Kawabata Testing

Kawabata bending testing was performed as described in the test method set forth above. The Kawabata bend test value was measured as 0.0715 grams force-cm$^2$/cm.

Example 11

A flexible circuit was prepared following the materials and processes of Example 8, except that the substrate was a 91 g/m$^2$ non-stretch, nylon woven material (Style 131859, (MI 270) from Milliken and Company, Spartanburg, S.C.).

Resistance Measurement v. Stretch

Resistance Measurement v. Stretch testing was performed as described in the test method set forth above. The resistance of the circuit increased significantly as the flexible circuit was elongated to 50% strain.

Wash Testing

Wash testing durability was performed as described in the test method set forth above. It was determined that the sample survived 1 wash cycle before 50% of the traces exceeded 1 Megaohm (MΩ) (Table 1).

MTVR

The moisture vapor transmission rate of the flexible circuit was measured as described in the test method set forth above. The MVTR was measured to be 1562 g/m$^2$/24 hours (Table 1).

Kawabata Testing

Kawabata bending testing of the flexible circuit performed as described in the test method set forth above. The Kawabata bend test value was measured as 0.0807 grams force-cm$^2$/cm.

TABLE 1

Summary of Results

| Example | Underlying Substrate | Lamination technique | Printing Substrate | Conductive Ink Position | Wash Testing (# of cycles for > 50% to reach 1 Megaohm) | Resistance vs. Stretch | Moisture Vapor Transmission Rate (g/m$^2$/24 hr) | Kawabata Bend Test (grams force-cm$^2$/cm) |
|---|---|---|---|---|---|---|---|---|
| 1 | Stretch Textile | Buckled | ePTFE Membrane 1 | Imbibed | >20 | Negligible | 16114 | 0.0418 |
| 2 | Stretch Textile | Buckled | ePTFE Membrane 1 | Surface | 3 | Negligible | 16085 | 0.0364 |
| 3 | Stretch Textile | Buckled | ePTFE Membrane 2 | Surface | 3 | Negligible | 14263 | 0.0348 |
| 4 | Stretch Textile | Buckled | Urethane (nonporous) | Surface | 1 | Negligible | 2459 | 0.0527 |
| 5 | Stretch Textile | Buckled | Polyethylene | Surface | 3 | Negligible | 9721 | 0.0970 |
| 6 | Stretch Textile | Flat | ePTFE Membrane 1 | Imbibed | 6 | Significant | 17127 | 0.0669 |
| 7 | Stretch Textile | Flat | ePTFE Membrane 1 | Surface | 1 | Significant | 16259 | 0.0544 |
| 8 | Stretch Textile | Flat | Urethane (nonporous) | Surface | 1 | Significant | 1852 | 0.0710 |
| 9 | Non-stretch textile | Flat | ePTFE Membrane 1 | Imbibed | 10 | Significant | 21119 | 0.0607 |
| 10 | Non-stretch textile | Flat | ePTFE Membrane 1 | Surface | 1 | Significant | 19239 | 0.0715 |
| 11 | Non-stretch textile | Flat | Urethane (nonporous) | Surface | 1 | Significant | 1562 | 0.0807 |

What is claimed is:

1. A conductive article having high flexibility and durability comprising:
   a printed circuit including:
      a porous synthetic polymer membrane; and
      at least one electrically conductive trace,
      wherein said at least one electrically conductive trace being imbibed within the porous synthetic polymer membrane to form a continuous network of conductive particles within the porous synthetic polymer membrane; and
   a substrate bonded to said printed circuit.

2. The conductive article of claim 1, wherein the porous synthetic polymer membrane is a microporous synthetic polymer membrane.

3. The conductive article of claim 1, wherein the substrate is a stretchable substrate or a non-stretchable substrate.

4. The conductive article of claim 3, wherein the stretchable substrate comprises at least one member selected from a stretchable textile, a stretchable fabric, a stretchable nonwoven material, or a stretchable membrane.

5. The conductive article of claim 3, wherein the stretchable substrate is a stretchable textile or stretchable fabric.

6. The conductive article of claim 3, wherein the stretchable substrate comprises a stretchable laminate or stretchable fibers.

7. The conductive article of claim 1, wherein the porous synthetic polymer membrane is selected from expanded polytetrafluoroethylene (ePTFE), polyvinylidene fluoride (PVDF), fluorinated ethylene propylene (FEP), perfluoroalkoxy alkane (PFA), polyester sulfone (PES), poly (p-xylylene) (ePPX), porous ultra-high molecular weight polyethylene (eUHMWPE), porous ethylene tetrafluoroethylene (eETFE), or porous polylactic acid (ePLLA).

8. The conductive article of claim 1, wherein the porous synthetic polymer membrane is an expanded fluoropolymer membrane.

9. The conductive article of claim 1, wherein the porous synthetic polymer membrane is an expanded polytetrafluoroethylene membrane.

10. The conductive article of claim 1, wherein the at least one electrically conductive trace fills pores of the porous synthetic polymer membrane through a thickness of the porous synthetic polymer membrane.

11. The conductive article of claim 1, wherein the at least one electrically conductive trace is selected from electrically conductive metal nanoparticles, nanoparticles of electrically conductive materials, electrically conductive nanotubes, electrically conductive metal flakes, electrically conductive polymers, or combinations thereof.

12. The conductive article of claim 1, wherein the at least one electrically conductive trace comprises particles of silver, platinum, gold, copper, or combinations thereof.

13. The conductive article of claim 1, wherein the at least one electrically conductive trace comprises a continuous network of conductive particles.

14. The conductive article of claim 1, wherein the at least one electrically conductive trace has a form of an electrically conductive pattern.

15. The conductive article of claim 1, wherein the conductive article has a wash durability of at least 10 wash cycles as determined by the Wash Test Durability test method.

16. The conductive article of claim 1, wherein the conductive article has a flexibility of less than 0.1 grams force-cm$^2$/cm as determined by the Kawabata test method.

17. The conductive article of claim 1, wherein the electrically conductive material is not present on a surface of the porous synthetic polymer membrane.

18. A conductive article having high flexibility and durability comprising:
   a first printed circuit including:
      a first porous synthetic polymer membrane; and
      a first electrically conductive trace imbibed within the first porous synthetic polymer membrane to form a continuous network of conductive particles within the first porous synthetic polymer membrane;
   a second printed circuit including:
      a second porous synthetic polymer membrane; and
      a second electrically conductive trace located within the second porous synthetic polymer membrane; and
   a substrate bonded to said first printed circuit on a first side and to said second printed circuit on a second side.

19. A conductive article comprising:
   a printed circuit including:
      an expanded polytetrafluoroethylene membrane; and
      at least one electrically conductive trace imbibed within pores of the expanded polytetrafluoroethylene membrane to form a continuous network of conductive particles; and
   a non-stretchable textile bonded to said printed circuit,
   wherein the at least one electrically conductive trace fills the pores through a thickness of the expanded polytetrafluoroethylene membrane,
   wherein the conductive article has a flexibility of less than 0.1 grams force-cm$^2$/cm as determined by the Kawabata Test,
   wherein the conductive article has a wash durability of at least 10 wash cycles as determined by the Wash Test Durability, and
   wherein the conductive article has a moisture vapor transmission rate of at least 21,000 g/m$^2$/24 hours as determined by the Moisture Vapor Transmission Rate (MVTR) Measurement.

* * * * *